April 21, 1959 A. I. ARONSON 2,883,479
CLASS B AMPLIFIER BIASING CIRCUIT
Filed July 28, 1955
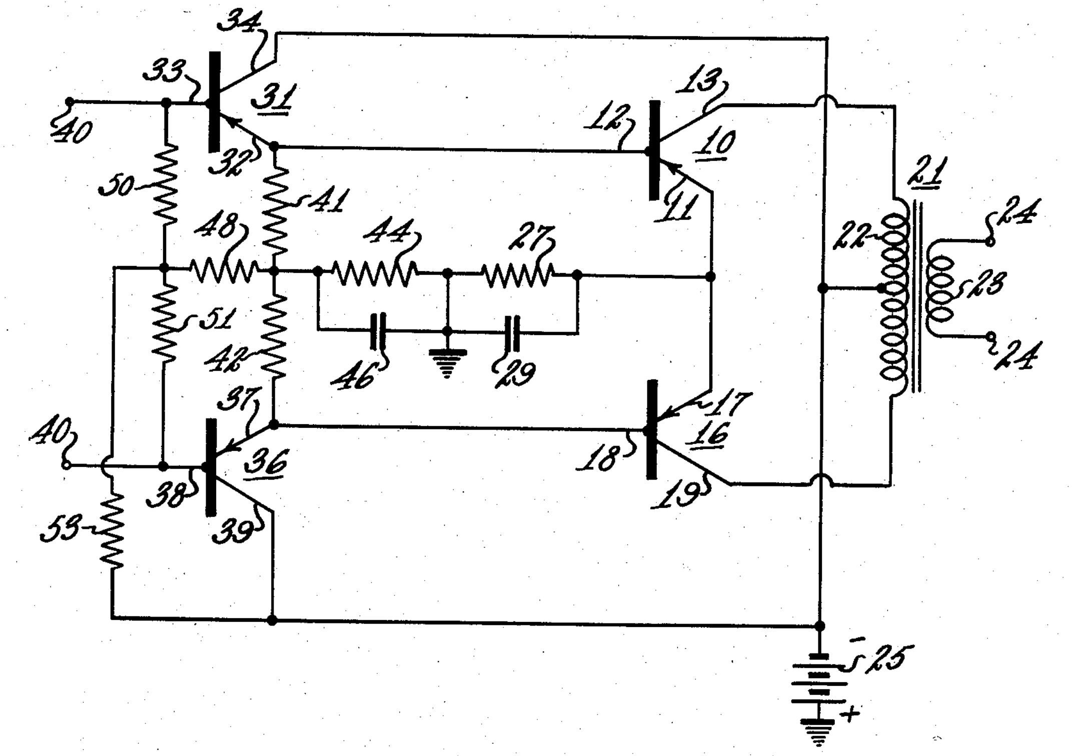
INVENTOR.
ALBERT I. ARONSON
BY
H. W. Newton
ATTORNEY United States Patent Office 2,883,479

Patented Apr. 21, 1959

2,883,479

CLASS B AMPLIFIER BIASING CIRCUIT

Albert I. Aronson, Collingswood, N.J., assignor to Radio Corporation of America, a corporation of Delaware Application July 28, 1955, Serial No. 524,882

3 Claims. (Cl. 179—171)

This invention relates generally to transistor signal amplifier circuits and more particularly relates to the stabilization of Class AB and to Class B amplifier circuits for achieving stable, low distortion operation.

The use of Class AB or Class B operation in transistor amplifier circuits offers two main advantages over other less efficient modes or classes of operation. First, the output circuit efficiency under the maximum signal condition is higher so that for a transistor of given power dissipation rating, the maximum obtainable power output is increased. Second, the power supply drain during periods of small signal or no signal is substantially reduced so that signals in which the duty cycle is low, as for example, speech and music signals, may be amplified more efficiently.

Operation at high ambient temperature is often a requirement for electronic equipment. Certain characteristics of transistors are temperature dependent. In particular, the collector current of certain transistors may tend to increase with temperature so that stable operation of transistor amplifier circuits at high temperatures may require the use of special circuits to keep the transistor operating point within reasonable limits and to keep the distortion at a reasonable value.

Various schemes have been used with varying degrees of success to compensate for these temperature variations. In Class A amplifier circuits, for example, direct current feedback has been used with success. In amplifiers of the Class B or Class AB type, however, where the direct current components are dependent on the amplitude of the signal, feedback compensation has not generally been used.

In the case of transistor amplifier circuits, it has been found that by placing a resistor having an appreciable resistance in series with the emitter lead, compensation for variations in temperature may be achieved. At the same time, however, the gain of the amplifier circuit is reduced, which is often undesirable. One way of maintaining the gain of the amplifier circuit is to bypass the emitter resistor with a capacitor. If this is done in Class B or AB amplifiers, however, distortion is introduced as the signal level changes due to changes in bias.

The problem in a Class B amplifier circuit is to establish the zero signal operating condition at an optimum value, the value generally being a function of temperature. The direct current output circuit voltage and current are not uniquely related to the input circuit bias under signal condition because of the variation of collector current with signal. Consequently, linear direct current feedback methods have not been found to be particularly satisfactory in stabilizing the operating point of transistor Class B amplifier circuits.

Accordingly, it is a principal object of this invention to provide an improved Class AB or Class B amplifier circuit in which efficient operation over a wide ambient temperature range may be attained and which is stable and free of distortion.

It is another object of the present invention to provide an improved Class AB or Class B signal amplifier circuit utilizing transistors wherein direct current feedback may be employed to provide stable, low distortion, and efficient transistor operation without loss of gain or output power.

A Class B or Class AB signal amplifier circuit utilizing transistors in accordance with the invention includes a pair of output stage transistors the emitters of which are connected through a degenerative resistor to ground. In order to avoid loss of gain and output power, this resistor is bypassed by a capacitor which in operation will charge in such direction as to provide reverse bias for the pair of output transistors. In order to avoid distortion caused by this reverse bias, a second pair of transistors connected in driving relation with the pair of output transistors and also connected for Class B or Class AB operation is adapted to provide a forward, signal-dependent bias for the output stage. This bias may be derived from a bias resistor connected in the emitter circuit of the second pair of transistors and bypassed by a capacitor. In this manner, changes in output circuit bias due to signal level changes are compensated for by a forward bias applied from the driver transistors, thereby to achieve stable, low distortion operation with little loss of gain or output power.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which the single figure is a schematic circuit diagram of a transistor Class B or AB signal amplifier circuit embodying the invention.

Referring now to the drawing, a Class B or Class AB signal amplifying circuit includes a pair of output circuit transistors 10 and 16 which respectively have a pair of emitter electrodes 11 and 17 connected in common to one terminal of bias resistor 27 the other terminal of which is connected to a point of reference potential for the circuit such as ground. The bias resistor 27 has a bypass capacitor 29 connected thereacross to provide a low impedance path at signal frequencies. The transistor 10 and 16 also have associated therewith a pair of base electrodes 12 and 18 and a pair of collector electrodes 13 and 19, respectively. The collector electrodes 13 and 19 are connected one to each end of the primary winding 22 of an output transformer 21 which also includes a secondary winding 23 which is connected to a pair of output terminals 24 from which output signals may be derived for operating, for example, a loud speaker.

Operating potential is applied to the collector electrodes 13 and 19 from a source of energizing potential illustrated as a battery 25, the positive terminal of which is connected to ground and the negative terminal of which is connected to a center tap of the primary winding 22.

The transistors 10 and 16 are shown for illustrative purposes to be of the PNP type. Transistors of opposite conductivity type may also be used in circuits of the invention, provided that energizing sources, such as the battery 25 have their polarity reversed.

The pair of output stage transistors 10 and 16 and associated circuitry comprise a signal output stage operating in either Class B or Class AB, depending upon the bias applied to the base electrodes 12 and 18. In the presence of signal, the emitter current in each of the transistors 10 and 16 will increase and cause the bypass capacitor 29 to charge in a direction to bias the emitter electrodes negative with respect to ground. This voltage is such that in the presence of a fixed bias potential applied to the base electrodes 12 and 18, relatively reverse bias will be applied at the emitter electrodes 11 and 17, causing the transistors 10 and 16 to be cut off for a period greater than ½ cycle. A form of distortion known as cross-over distortion will thereby be generated by the output stage transistors 10 and 16.

A driver circuit, including a pair of driver transistors 31 and 36 provides input signals for the output stage, and in addition provides a signal dependent compensating forward bias for the output stage transistors 10 and 16 in order to overcome the reverse bias applied to the emitter electrodes 11 and 17 by the bypass capacitor 29, thereby to avoid the aforementioned cross-over distortion. The driver transistors 31 and 36 respectively include base electrodes 33 and 38, emitter electrodes 32 and 36, and collector electrodes 34 and 39. The collector electrodes 34 and 39 are connected to the negative terminal of the battery 25. The emitter electrodes 32 and 37 are connected to the base electrodes 12 and 18, respectively, through a direct-current conductive path illustrated as a direct connection to provide translation of both signal and the aforementioned compensating bias to the output stage.

A driver stage load resistor for the transistor 31 is connected between the emitter electrode 32 and one terminal of a bias resistor 44, the other terminal of which is connected to ground. In like manner, a driver stage load resistor 42 for the transistor 36 is connected between the emitter electrode 37 and the junction of the resistor 41 and the bias resistor 44. A bypass capacitor 46 is connected across the bias resistor 44 in order to provide a low impedance path at signal frequencies.

The base electrodes 33 and 38 are connected to a pair of input terminals 40 to which a balance input signal may be applied. Input circuit biasing for the driver stage is provided by a bias network consisting of a resistor 53 connected by the negative terminal of the battery 25 and the junction of a pair of resistors 50 and 51 connected in series relation between the base electrodes 33 and 38. A resistor 48 is connected between the junction of resistors 50 and 51 and the junction of resistors 41 and 42.

In operation, a balanced input signal from any convenient source of signals is applied between the pair of input terminals 40, and thence between the base electrodes 33 and 38 of the driver stage. The signal is amplified by the driver stage transistors 31 and 36 which are effectively connected in a grounded collector configuration. The driver stage transistors 31 and 36 are biased such that the collector current in the transistors is zero for up to one half cycle of input signal, that is to say, in Class AB or Class B.

In consequence, the driver stage bypass capacitor 46 charges in such a direction to cause a negative voltage to appear at the emitter electrodes 32 and 37 in response to signals applied between the base electrodes 33 and 38. This negative direct voltage is applied, along with the signal, to the base electrodes 12 and 18 of the output stage, where it causes the output stage transistors to conduct more heavily in response to signals applied to the pair of amplifier input terminals 40.

The output stage transistors 10 and 16, which are also biased for Class AB or Class B operation, develop a direct voltage across the output stage bypass capacitor 29 which tends to cut off the output stage transistors 10 and 16 in the presence of signals, which tends to produce the aforementioned crossover distortion. The forward bias applied to the base electrodes 12 and 18, however, tends to cancel the effect of reverse bias produced by the action of the bypass capacitor 29 and bias resistor 27. If the values of the driver stage emitter bias resistor 44 and bypass capacitor 46 are properly chosen, therefore, the signal will have essentially no effect upon the base to emitter electrode bias of the output stage transistors 10 and 16.

It may be found to be desirable to make the time constants of the network associated with the emitter bypass capacitors 46 and 29 equal in order to avoid the creation of transient bias voltages between the base and emitter electrodes of the output stage transistors in response to sudden changes in the signal level applied to the amplifier circuit.

It is noted that the driver stage may be operated in Class AB, while the driver stage is operated in Class B. Satisfactory bias for the output stage is then provided by increasing the value of the driver stage emitter resistor 44 until the signal-induced voltage thereacross is approximately equal to the signal-induced voltage across the output stage emitter resistor 27. In similar fashion, any combination of classes of operation of the driver stage and the output stage may be accommodated.

A certain amount of reverse bias will be applied to the driver stage due to the action of the emitter resistor 44 and bypass capacitor 46. The driver stage is operated essentially in a grounded collector arrangement, however, and little or no difficulty has been experienced with cross-over distortion in this stage.

An amplifier circuit in accordance with the invention provides stable operation of the transistors therein without loss of gain or output power, and this permits substantially full realization of the advantages of Class B operation of the transistors.

What is claimed is:

1. A signal amplifier circuit comprising in combination, a Class B output stage including a first pair of transistors each having base, emitter, and collector electrodes, direct current stabilization means including the parallel combination of a first resistor and a first capacitor connected with the emitter electrodes of said transistors in common, balanced output circuit means connected with the collector electrodes of said transistors, a class B driver stage including a second pair of transistors each having base, emitter and collector electrodes, the emitter electrodes of said second pair of transistors being connected respectively to the base electrodes of said first pair of transistors, balanced input circuit means connected with the base electrodes of said second pair of transistors, and means including the parallel combination of a second resistor and a second capacitor connected with the emitter electrodes of said second pair of transistors to provide direct current stabilization for said driver stage and bias compensation for said output stage.

2. A Class B signal amplifier comprising in combination, an output stage and a driver stage connected in cascade relation, and having a common ground circuit, said output stage including a first pair of transistors each having base, emitter, and collector electrodes, output circuit means coupled with said collector electrodes, said emitter electrodes being connected in common through the parallel combination of a first bias resistor and a first bypass capacitor to said ground circuit point, energizing means connected between said ground circuit and said output circuit means, said driver stage including a second pair of transistors each having base, emitter and collector electrodes, means including the parallel combination of a second bias resistor and a second bypass capacitor connecting the emitter electrodes of said second pair with said ground circuit, direct current conductive means connecting each of the emitter electrodes of said second pair of transistors respectively to the base electrodes said first pair of transistors, and balanced input circuit means coupled with the base electrodes of the transistors of said driver stage.

3. A Class B signal amplifier circuit comprising, in combination, an output stage including a first pair of transistors each having base, emitter, and collector electrodes, signal output circuit means connected between the collector electrodes of said first pair of transistors, direct-current feedback stabilization means including a first resistor and a first by-pass capacitor connected in common with the emitter electrodes of said first pair of transistors providing direct-current operating point stabilization and a signal dependent reverse bias for said first pair of transistors, a driver stage including a second pair of transistors each having base, emitter, and collector electrodes, signal input circuit means connected with the base electrodes of said second pair of transistors, direct-current conductive means connecting the emitter electrodes of said second pair of transistors respectively to the base electrodes of said first pair of transistors, and direct-current feedback stabilization means including a second resistor and a second by-pass capacitor connected in common with the emitter electrodes of said second pair of transistors providing a signal dependent forward bias for said first pair of transistors which is applied thereto through said direct-current conductive means to compensate for said signal dependent reverse bias and provide substantially distortion free circuit operation of said first pair of transistors.

References Cited in the file of this patent

UNITED STATES PATENTS

| | | |
|---|---|---|
| 2,070,071 | Stromeyer | Feb. 9, 1937 |
| 2,217,269 | Foster | Oct. 8, 1940 |
| 2,554,279 | Tharp | May 22, 1951 |
| 2,794,076 | Shea | May 28, 1957 |

FOREIGN PATENTS

| | | |
|---|---|---|
| 264,142 | Switzerland | Jan. 3, 1950 |

OTHER REFERENCES

"Principles of Transistor Circuits," John Wiley & Sons, inc. Copyright 1953, particularly pp. 102–124. (Copy in Patent Office Library.)